United States Patent
Yehezkely et al.

(10) Patent No.: US 11,689,053 B2
(45) Date of Patent: Jun. 27, 2023

(54) TECHNIQUES FOR TUNING AN ANTENNA OF AN ENERGY HARVESTER

(71) Applicant: Wiliot, Ltd, Caesarea (IL)

(72) Inventors: Alon Yehezkely, Haifa (IL); Dina Leschinsky, Atlit (IL); Tom Cohen, Haifa (IL)

(73) Assignee: WILIOT, LTD., Caesarea (IL)

( * ) Notice: Subject to any disclaimer, the term of this patent is extended or adjusted under 35 U.S.C. 154(b) by 34 days.

(21) Appl. No.: 17/387,543

(22) Filed: Jul. 28, 2021

(65) Prior Publication Data
US 2023/0030439 A1 Feb. 2, 2023

(51) Int. Cl.
*H02J 50/00* (2016.01)
*H03H 7/38* (2006.01)
*G06K 19/077* (2006.01)
*G06K 19/07* (2006.01)
*H04W 84/18* (2009.01)

(52) U.S. Cl.
CPC ........ *H02J 50/001* (2020.01); *G06K 19/0709* (2013.01); *G06K 19/07773* (2013.01); *H03H 7/38* (2013.01); *H04W 84/18* (2013.01)

(58) Field of Classification Search
CPC .......... G06K 19/0715; G06K 19/0707; G06K 19/0726; G06K 19/0723; G06K 7/0008; H02J 50/402; H02J 50/001; H02J 50/20
USPC ....................................................... 307/104
See application file for complete search history.

(56) References Cited

U.S. PATENT DOCUMENTS

| | | | |
|---|---|---|---|
| 4,099,068 | A | 7/1978 | Kobayashi et al. |
| 8,955,757 | B2 * | 2/2015 | Jung ........................ H02J 50/20 |
| | | | 235/492 |
| 10,727,856 | B2 * | 7/2020 | Wu ..................... H03M 1/0624 |
| 2006/0094425 | A1 | 5/2006 | Mickle et al. |
| 2009/0091503 | A1 | 4/2009 | Shepherd |
| 2010/0219789 | A1 | 9/2010 | Bermak et al. |
| 2011/0175461 | A1 | 7/2011 | Tinaphong |
| 2012/0030486 | A1 | 2/2012 | Pop et al. |
| 2012/0038528 | A1 | 2/2012 | Chiang |
| 2013/0200727 | A1 | 8/2013 | Yakovlev et al. |

(Continued)

OTHER PUBLICATIONS

Frederik Dostal. "New Advances in Energy Harvesting Power Conversion". Sep. 2015. https://www.analog.com/en/analog-dialogue/articles/energy-harvesting-power-conversion.html.

(Continued)

*Primary Examiner* — Quan Tra
(74) *Attorney, Agent, or Firm* — M&B IP Analysts, LLC.

(57) ABSTRACT

An energy harvester and a method for tuning an antenna frequency of the energy harvester is provided. The energy harvester includes: a tuner circuit coupled to at least one antenna, wherein the tuner circuit includes at least one adjustable capacitor, wherein the at least one antenna is configured to harvest an electromagnetic ambient energy; a controller connected to the tuner circuit, wherein the controller is configured to control a voltage level within the energy harvester, wherein the controller is configured to iteratively set the at least one adjustable capacitor to tuning states until a best tuning state is set, wherein the best tuning state of the at least one adjustable capacitor substantially matches an antenna frequency and a frequency of the electromagnetic ambient energy; and a rectifier to convert the electromagnetic ambient energy to a direct current.

16 Claims, 6 Drawing Sheets

(56) References Cited

U.S. PATENT DOCUMENTS

| | | |
|---|---|---|
| 2014/0329472 A1 | 11/2014 | Kovacs et al. |
| 2015/0128733 A1 | 5/2015 | Taylor et al. |
| 2016/0028375 A1 | 1/2016 | Feldman et al. |
| 2016/0164495 A1 | 6/2016 | Backes et al. |
| 2017/0179732 A1 | 6/2017 | Hoeppner et al. |
| 2017/0288415 A1 | 10/2017 | Vaidya et al. |
| 2017/0308783 A1 | 10/2017 | Rokhsaz et al. |
| 2018/0145418 A1 | 5/2018 | Tai |
| 2018/0287259 A1 | 10/2018 | Svendsen et al. |
| 2018/0331580 A1 | 11/2018 | Larosa et al. |
| 2019/0067802 A1* | 2/2019 | Carter .................. H02J 50/20 |
| 2019/0095769 A1 | 3/2019 | Lektomiller |
| 2019/0258833 A1* | 8/2019 | Caselli .............. G06K 7/10148 |
| 2019/0363428 A1 | 11/2019 | Zhu et al. |
| 2019/0363746 A1 | 11/2019 | Zalewski et al. |
| 2020/0067352 A1 | 2/2020 | Kothari |
| 2020/0169122 A1 | 5/2020 | Prakriya et al. |
| 2020/0177106 A1 | 6/2020 | Wilson et al. |
| 2020/0195233 A1 | 6/2020 | Zachara |
| 2020/0220258 A1 | 7/2020 | Shi et al. |
| 2020/0251228 A1 | 8/2020 | Elboim et al. |
| 2020/0287583 A1 | 9/2020 | Farahvash et al. |
| 2020/0321514 A1 | 10/2020 | Sadr |
| 2020/0321862 A1 | 10/2020 | Bose et al. |
| 2020/0350940 A1 | 11/2020 | Backes et al. |
| 2020/0366298 A1 | 11/2020 | Etou et al. |
| 2021/0070115 A1 | 3/2021 | Rokhsaz et al. |
| 2022/0006333 A1* | 1/2022 | Yeo ....................... H02J 50/20 |

OTHER PUBLICATIONS

G. Charalampidis, et al. "Power estimation of RF energy harvesters". Energy Procedia 157 (2019). https://www.sciencedirect.com/science/article/pii/S1876610218312268.

K Kozalakis, et al. "Energy harvesting circuits power measuring system". IEEE Conference: 2020 15th Design and Technology of Integated Systems in Nanosclae Era (DTIS). https://ieeexplore.ieee.org/abstract/document/9080939.

Y Luo, et al. "RF Energy Harvesting Wireless Communications: RF Environment, Device Hardware and Practical Issues". Sensors, 19, 3010 (2019). https://.www.mdpi.com/1424-8220/19/13/3010.

* cited by examiner

TECHNIQUES FOR TUNING AN ANTENNA OF AN ENERGY HARVESTER

TECHNICAL FIELD

The present disclosure generally relates to wireless Internet of things (IoT) devices, and more particularly to power harvesting devices.

BACKGROUND

The Internet of things (IoT) is the inter-networking of physical devices, vehicles, buildings, and other items embedded with electronics, software, sensors, actuators, and network connectivity that enable these objects to collect and exchange data. IoT is expected to offer advanced connectivity of devices, systems, and services that goes beyond machine-to-machine (M2M) communications and covers a variety of protocols, domains, and applications.

IoT can be encapsulated in a wide variety of devices, such as heart monitoring implants; biochip transponders on farm animals; automobiles with built-in sensors; automation of lighting, heating, ventilation, air conditioning (HVAC) systems; and appliances such as washer/dryers, robotic vacuums, air purifiers, ovens or refrigerators/freezers that use Wi-Fi for remote monitoring. Typically, IoT devices encapsulate wireless sensors or a network of such sensors.

Most IoT devices are wireless devices that collect data and transmit such data to a central controller. There are a few requirements to be met to allow widespread deployment of IoT devices. Such requirements include reliable communication links, low energy consumption, and low maintenance costs.

To this aim, IoT devices and wireless sensors are designed to support low power communication protocols, such as Bluetooth low energy (BLE), LoRa, and the like. However, IoT devices utilizing such protocols require a battery, e.g., a coin battery. The reliance on a power source (e.g., a battery) is a limiting factor for electronic devices, due to, for example, cost, size, lack of durability to environmental effects, and frequent replacements.

An alternative to using batteries, a self-sufficient or self-sustainable power supply that may harvest energy from sources such as light, heat, activity, piezoelectric, and electromagnetic energy can be incorporated. Electromagnetic energy that includes radio frequency (RF) is promising in its relatively unrestricted spatial freedom and abundance. An energy harvester as such often includes, but not limited to, an antenna, a rectifier circuit, a capacitor, or a rechargeable battery to store energy, and a power management unit to distribute and manage power as needed.

A rectifier circuit, which includes at least one diode, converts wireless electromagnetic signals to direct current (DC). Such rectifier is coupled to at least one antenna that is capable of receiving energy over-the-air. The antenna, in particular, influences the efficiency of the energy harvester, and typically designed to maximize reception of energy, and thus energy harvesting. The design of the antenna determines the harvesting frequency range, and may be influenced by difference in material, shape, size, and number.

When designing an antenna for energy harvesting purposes, there is a tradeoff between the performance and the antenna bandwidth, which is the frequency range in which the antenna harvests energy. Though greater range of energy sources may be collected with a wide bandwidth, energy harvesting is more effective when the antenna and the energy source frequency matches. In addition, energy harvester performance is higher with narrower antenna bandwidth since the voltage at the input of the rectifier circuit is higher with a high-Q antenna interfacing network. However, if the antenna band does not match the frequency of the energy source, even with the abundance of electromagnetic energy, only portions may be harvested for energy, which significantly decreases efficiency.

In this sense, antennas are often designed to match the frequency of the incident energy in the surrounding to maximize over-the-air harvesting. Multiple antennas have been incorporated into a single energy harvester in different shapes and sizes. Furthermore, energy harvesters with impedance tuner circuits that change antenna frequency have been incorporated. Capacitive tuning of the antenna may be obtained using common CMOS technology devices such as transistors, varactors, and MOSCAPs in the integrated circuitry. However, maintaining a constant chip impedance at the antenna interface given the transition in voltage supply still remains a challenge.

While impedance tuning allows some frequency matching, performing such modification consumes and may even drain-out the harvester energy storage. In addition, it is difficult to perform frequency tuning without knowledge of the frequency of the available electromagnetic energy in the surrounding and the status of the energy harvester. To effectively maintain and increase performance of an IoT device, close monitoring of and implementing means to increase energy harvester efficiency is strongly desired.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a method for tuning an antenna frequency of an energy harvester. The method comprises setting an antenna tuner to a first tuning state, wherein the first tuning state sets the antenna frequency to a first frequency and includes a first charge time, wherein the first charge time is a shortest charge time currently known; discharging an energy storage coupled to the energy harvester to a first voltage level; setting the antenna tuner to a second tuning state, wherein the second tuning state changes the antenna frequency to a second frequency; harvesting an ambient energy until a predefined time interval; setting the antenna tuner to the first tuning state; starting a time counter upon reaching the predefined time interval; measuring a second charge time for the energy storage to reach a reference level, wherein the reference level is a predetermined voltage level; and replacing the first tuning state with the second tuning state as a new first tuning state when the second charge time is less than the first charge time, wherein replacing is indicative of frequency matching of the second frequency and an ambient energy frequency.

Certain embodiments disclosed herein include an energy harvester comprising a tuner circuit coupled to at least one antenna, wherein the tuner circuit includes at least one adjustable capacitor, wherein the at least one antenna is configured to harvest an electromagnetic ambient energy; a controller connected to the tuner circuit, wherein the controller is configured to control a voltage level within the energy harvester, wherein the controller is configured to iteratively set the at least one adjustable capacitor to tuning states until a best tuning state is set, wherein the best tuning state of the at least one adjustable capacitor substantially matches an antenna frequency and a frequency of the electromagnetic ambient energy; and a rectifier to convert the electromagnetic ambient energy to a direct current.

Certain embodiments disclosed herein also include a wireless internet of things (IoT) tag comprising at least one antenna configured to harvest an ambient energy, wherein the at least one antenna has a capacitive interface; an energy harvester coupled to the at least one antenna, wherein the energy harvester includes a tuner circuit, a controller, and a rectifier, wherein the tuner circuit includes at least one adjustable capacitor, wherein the controller is connected to the tuner circuit, wherein the controller is configured to iteratively set the at least one adjustable capacitor to tuning states until a best tuning state is set, wherein the best tuning state of the at least one adjustable capacitor substantially matches an antenna frequency and a frequency of the ambient energy; an energy storage coupled to the energy harvester and configured to store harvested energy; and an energy detector connected to the energy storage, wherein the energy detector is configured to measure a charge time of the energy storage and activate the controller.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Figure 1:
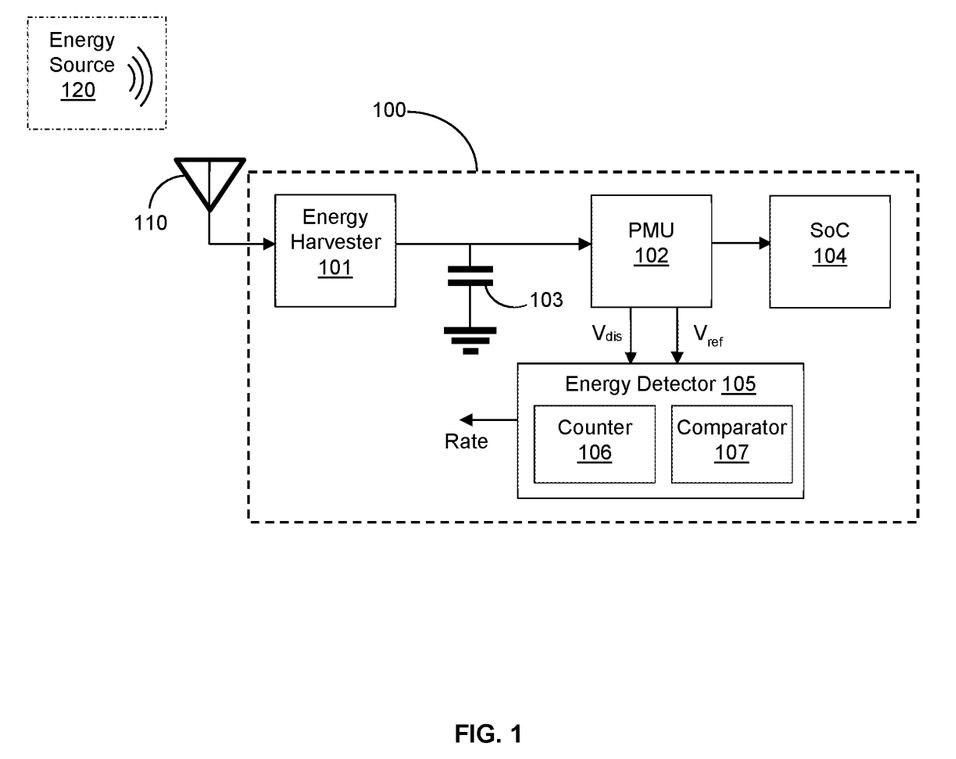
FIG. 1 is a block diagram of an Internet of things (IoT) tag according to an embodiment.

FIG. 1 shows an example block diagram of an Internet of things (IoT) tag according to an embodiment. The IoT tag or device 100 includes an energy harvester 101 coupled to at least one antenna 110 to harvest energy from an external energy source 120. In an example embodiment, the energy source 120 may be electromagnetic energy available from existing wireless signals that exist in the environment of the IoT tag 100. Such wireless signals may comply with known wireless standards, such as Wi-Fi (IEEE 802.11) which operates at the 2.4 GHz and 5-6 GHz bands, the BLE protocol which operates in the 2.400-2.4835 GHz band, Wi-Gig which operates at the 60 GHz band, cellular signals that comply with cellular standards (such as 2G, 3G, LTE, 4G, 5G, 5G mm Wave, and the like), and Industrial, Scientific, and Medical (ISM) frequency band such as sub 1 Ghz, frequency modulation (FM) radio signals, and the like.

The IoT tag 100 further includes a power management unit (PMU) 102 and an energy storage, such as a capacitor, 103 to power a system on chip (SoC) 104. The PMU 102 is a circuit block that performs general circuit power related operations, such as supply regulation, voltage and current references, power modes control, management of power storage unit, and more. The SoC 104 may be a logic circuit, an analog circuit, or combination thereof, that are designed to perform any action using the harvester energy from the energy harvester 101. According to the disclosed embodiments, the PMU 102 is connected to an energy detector 105. The energy detector 105 is configured to measure the energy-charging rate of the energy storage 103 by the energy harvester 101. In an embodiment, the PMU 102 is configured to monitor the energy level at the energy storage 103, while energy detector 105.

The antenna 110 is used to harvest energy from radio frequency (RF) signals, such as Bluetooth Low Energy (BLE) signals. In an embodiment, the antenna 110 is, but not limited to, a small loop antenna, a large loop antenna, a small dipole antenna, a dipole antenna, a dipole over ground antenna, a Yagi antenna, a patch antenna, or a microstrip antenna. In further configurations, a plurality of antennas may be used to harvest energy, each of which is designed to receive signals from same or different frequencies. A non-limiting example of such multi-band harvesting is described in more detail in U.S. application Ser. No. 16/356,618 to Yehezkely, assigned to the common assignee, and the contents of which are hereby incorporated by reference.

The antenna 110 operates most efficiently at a specific frequency range, referred as a bandwidth, with an optimal frequency known as a resonance frequency. The resonance frequency is achieved when a capacitance and an inductance characteristic of the antenna 110 nullify each other. In one embodiment, a wide bandwidth antenna 110 is used to receive signals from wide range of frequencies. In this case, greater input power energy can be harvested while risking interferences from undesired frequency noises.

In another embodiment, the antenna 110 is a narrow bandwidth antenna designed to collect particular frequency band. In this configuration, the narrow bandwidth antenna 110 may be limited in its bandwidth of the energy sources, but higher energy conversion efficiencies are returned from frequency matching between the antenna 110 and the energy source 120.

In an embodiment, the energy storage 103 is a capacitor that stores the energy that is harvested from the antenna 110 and passed through the energy harvester 101 as direct current (DC). This energy is stored until utilized by the SoC 104. In some configurations, the energy storage 103 is an on-die capacitor. In other configurations, the energy storage 103 may include an external rechargeable battery. In such configuration, the external battery is disconnected, and the energy level is determined via a capacitance storage device.

In an embodiment, the energy detector 105 is configured to measure the charge time of the energy storage 103 and determine the energy-charging rate of the energy storage 103 from a discharge level to a reference level. In an example embodiment, the energy detector 105 may be realized using a time counter 106 and a comparator 107. As discussed further below in FIG. 2 and FIG. 3, the energy-charging rate is used to estimate the absolute and relative input power level received at the antenna 110, which in return determines the efficiency of the energy harvester 101 in the environment. The disclosed embodiments show an IoT tag 100 including a single energy harvester 101. However, a plurality of energy harvesters 101 may be connected to the same energy storage 103 in the IoT tag 100. In such configuration, the energy-charging rate of each energy harvester may be determined by disconnecting the other energy harvesters from the energy storage 103.

In an embodiment, the SoC 104 is the energy consumption component coupled to the energy harvester 101 for execution functions. The SoC may be configured to carry out processes independently or under the control of a microcontroller (not shown).

Figure 2:
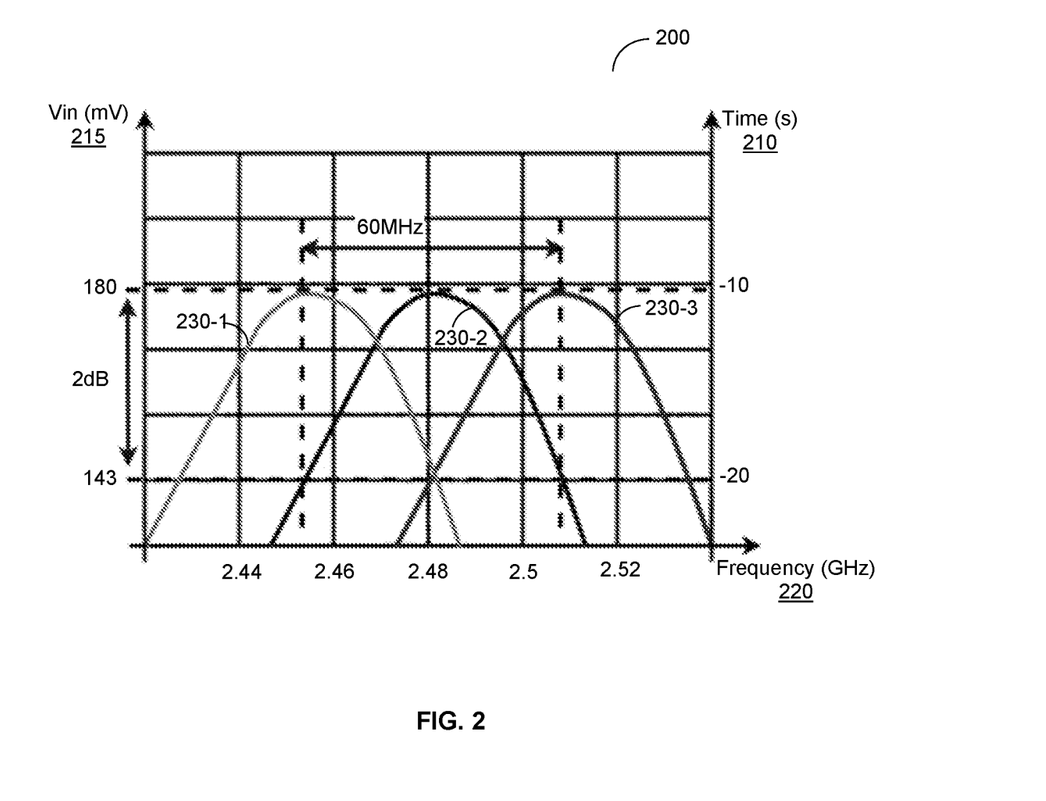
FIG. 2 is a graph of a charge time of an energy storage and an input voltage as a function of a frequency measured according to an embodiment.

FIG. 2 is an example graph 200 of a charge time 210 of the energy storage (103, FIG. 1) and an input voltage 215 as a function of a frequency 220, measured in Gigahertz (GHz). The input voltage 215 at the rectifier correlates with the incident power level from the energy source 120 at the antenna 110 (FIG. 1). Three separate plots 230-1 through 230-3 (hereinafter referred to individually as a plot and collectively as plots 230) are displayed of different resonance frequencies: 2.45, 2.48, and 2.51 GHz, respectively.

As shown in plot 230-1, for an antenna with a resonance harvesting frequency of 2.45 GHz, the energy storage charge time is 10 seconds at resonance frequency, but increases to 20 seconds at frequencies of approximately 2.43 and 2.48 GHz. Similar increase in charge time is observed in the other plots 230 with deviation to lower and/or higher frequencies from their respective resonance frequencies. The plot 230-1 shows greatest input voltage 215 at the resonance frequency of 2.45 GHz which decreases at lower and/or higher frequencies due to frequency mismatch between the antenna and the surrounding energy sources.

It should be noted that each plot 230 produce different charge time 210 and input voltage 215 trend with shift in resonance frequency. In an embodiment, the charge time can be recorded to determine the input power levels as well as their corresponding frequencies as an indicator of harvester efficiency and antenna-input frequency mismatch.

Figure 3:
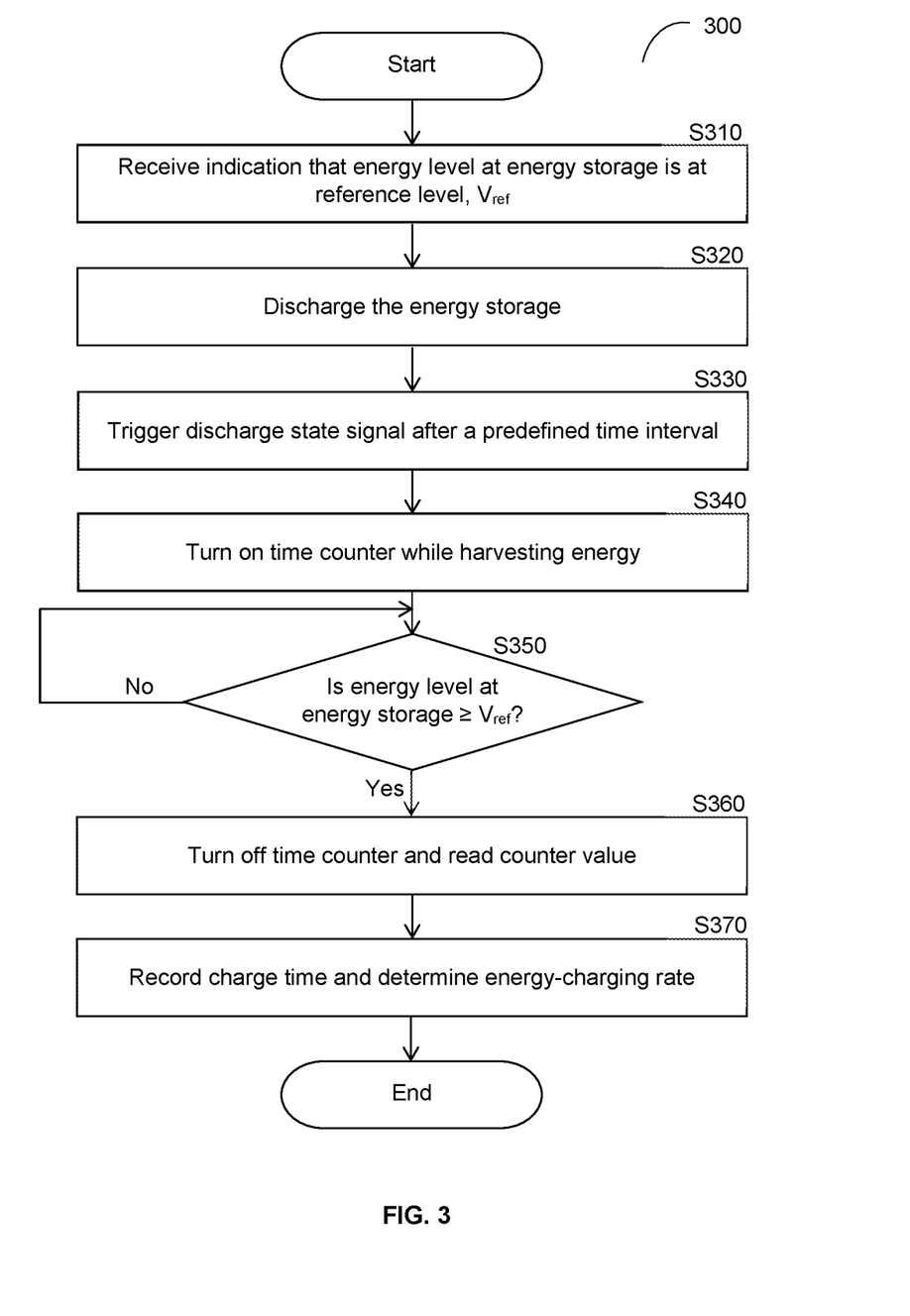
FIG. 3 is a flowchart illustrating a method of measuring an energy-charging rate of an energy storage device according to an embodiment.

FIG. 3 shows an example flowchart 300 illustrating a method for measuring an energy-charging rate of an energy storage by harvesting energy according to an embodiment.

At S310, an indication that the energy level at the capacitor is at a reference level is received. The reference level may be voltage level ($V_{ref}$) which may be equal to 1 volt. In an embodiment, the indication is triggered by a comparator (not shown).

At S320, the energy storage is discharged by performing a predefined discharge action. The predefined discharge action is the same action being performed at any time that a discharge operation is required. Such discharge operation is selected so as to not fully discharge the energy storage, but at the same time, the discharge should be sufficient enough to allow time counting of the energy storage recharge. In some example embodiments, discharge operations being selected causes that the energy storage to discharge to a level that is below 10% of the reference level. Such operations may include writing to a memory (in the SoC), reading from a memory (in the SoC), initiating a signal reception, and so on.

At S330, a discharge state signal is trigged. The signal may be triggered after a predefined time interval. Such signal indicates that the energy level at the energy storage may reach a discharge voltage level ($V_{dis}$). The predefined time interval is a function of the time constant ($\tau$) of the energy storage. It should be noted that it is not necessary to measure the discharge voltage level ($V_{dis}$) or the difference between the $V_{ref}$ to $V_{dis}$, as the discharge operation is always the same.

At S340, upon reception of the discharge state signal, the time counter is turned on while the energy is harvested. The time counter continues to record the passing time to determine the charge time of the energy storage until the energy level at the energy storage reaches back to the reference level ($V_{ref}$). To this end, at S350, it is checked if the energy level at the energy storage is equal or greater than $V_{ref}$. If so, execution continues with S360; otherwise, execution waits at S350.

At S360, the counter is turned off, i.e., stopping the count. Further, the counter value which is the time elapsed from starting to stopping the count is read from the counter. This value is referred to as the charge time.

At S370, the charge time, $\Delta T$, is recorded and energy-charging rate is determined.

The energy-charging rate may be determined as follows:

$$\text{Charging Rate} = \frac{\Delta V}{\Delta T} = \frac{V_{ref} - V_{dis}}{T_1 - T_0}$$

where $\Delta V$ is the change in energy storage voltage level, $\Delta T$ is the change in time, $V_{ref}$ is the reference level, $V_{dis}$ is the discharge level, $T_1$ is the time when the energy storage reaches back to $V_{ref}$, and $T_0=0$ which is the time when time counter is turned on.

In an embodiment, the determined energy-charging rate is provided to the energy harvester for tuning and may be saved in a memory for future reference. In a further embodiment, this information is used to determine the input power level and/or frequency of the energy source at the antenna. Additionally, such information may be translated to compute energy conversion efficiency of the energy harvester.

In an embodiment, when the energy-charging rate is less than a predefined threshold charging rate, an antenna frequency shift, and/or an antenna and energy source frequency mismatch is declared, thereby triggering an antenna tuner. In another embodiment, the antenna tuner is triggered when the charging rate is less than a predetermined best charging rate. The value of the best charging rate is stored in a memory of the SoC (e.g., SoC 104 of FIG. 1). The operation of the antenna tuner is discussed below.

In an embodiment, such triggering of the antenna tuner by the energy detector may be utilized for sensing applications such as motion sensor, a proximity sensor, or both. Such sensors are configured to detect electromagnetic signal changes in the environment when it is placed near a particular object, surface, or the life. The signal changes may be determined by the change in energy-charging rate as well as activation of the antenna tuner. In another example embodiment, a moisture sensor may be realized by incorporating materials such as polyimide film, for example, to determine humidity change in the surrounding.

Figure 4:
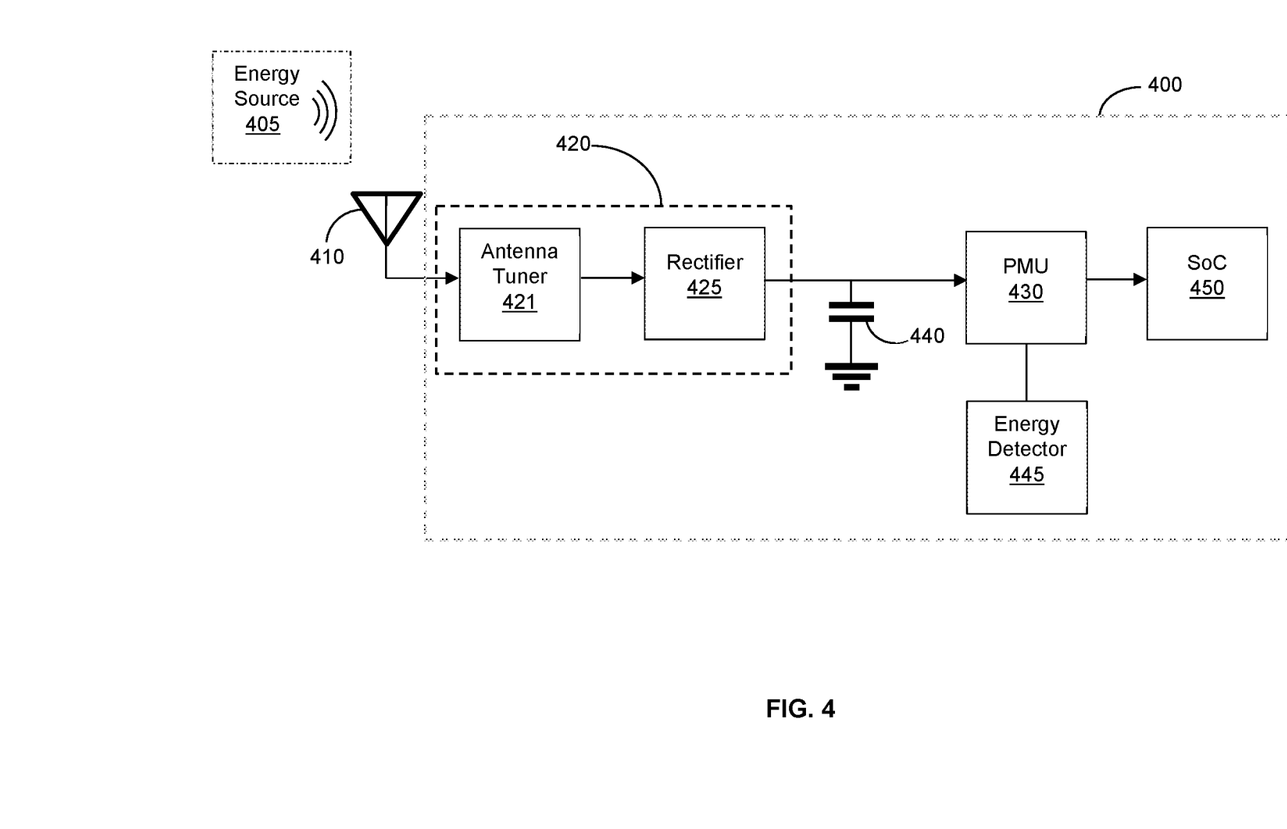
FIG. 4 is a block diagram of an IoT tag including an energy harvester designed with an antenna tuner according to an embodiment.

FIG. 4 is an example block diagram of an IoT tag 400 including an energy harvester designed with an antenna tuner according to an embodiment. The IoT tag 400 is coupled to an antenna 410 and includes an energy harvester 420, a power management unit (PMU) 430, an energy storage 440, and a SoC 450. Here, the PMU 430 is configured to manage the harvester energy and regulated operations, such as supply regulation, voltage and current references, management of energy storage 440, and more.

In an embodiment, the energy harvester 420 includes an antenna tuner 421 and a rectifier 425 to receive over-the-air signals using the antenna 410. The antenna tuner 421 is configured to change the antenna interface impedance, thereby tuning a frequency of the antenna 410 for maximum energy reception. In an embodiment, the energy storage 440 may be at an output of the energy harvester 420.

In an embodiment, the PMU 430 is coupled to an energy detector 445 that includes a time counter and a comparator (106 and 107, respectively, FIG. 1). As disclosed in the above embodiment, such energy detector 445 measures and derives the charging rate in order to estimate the input power level at the antenna 410 and the energy conversion efficiency of the energy harvester 420. In another embodiment, such information may be utilized to activate the antenna tuner 421. For example, when low incident voltage is detected at the input of the rectifier that is connected to antenna 410, the antenna tuner 421 may be triggered to adjust the frequency band of the antenna 410 close to the input energy frequency by changing the antenna interface capacitance. Further optimization may be performed to maximize over-the-air harvesting at IoT tag 400 surroundings. In some embodiments, frequency shifts may occur from manufacturing, environmental effects, nature of the protocol, e.g., BLE advertised at different channels, or type of electromagnetic (or RF) source available in the vicinity of the IoT tag.

The antenna tuner 421 is configured to match frequencies of the energy source 405 and the antenna 410 and in return increases the charging rate and efficiency. It has been identified, however, that such antenna tuning depletes energy that was harvested by the energy harvester 420. Therefore, in a self-sustainable IoT tag 400 as disclosed, the various disclosed embodiments provide a solution for antenna tuning at low voltage levels that are functional at untuned conditions by design of the antenna tuner 421.

Figure 5:
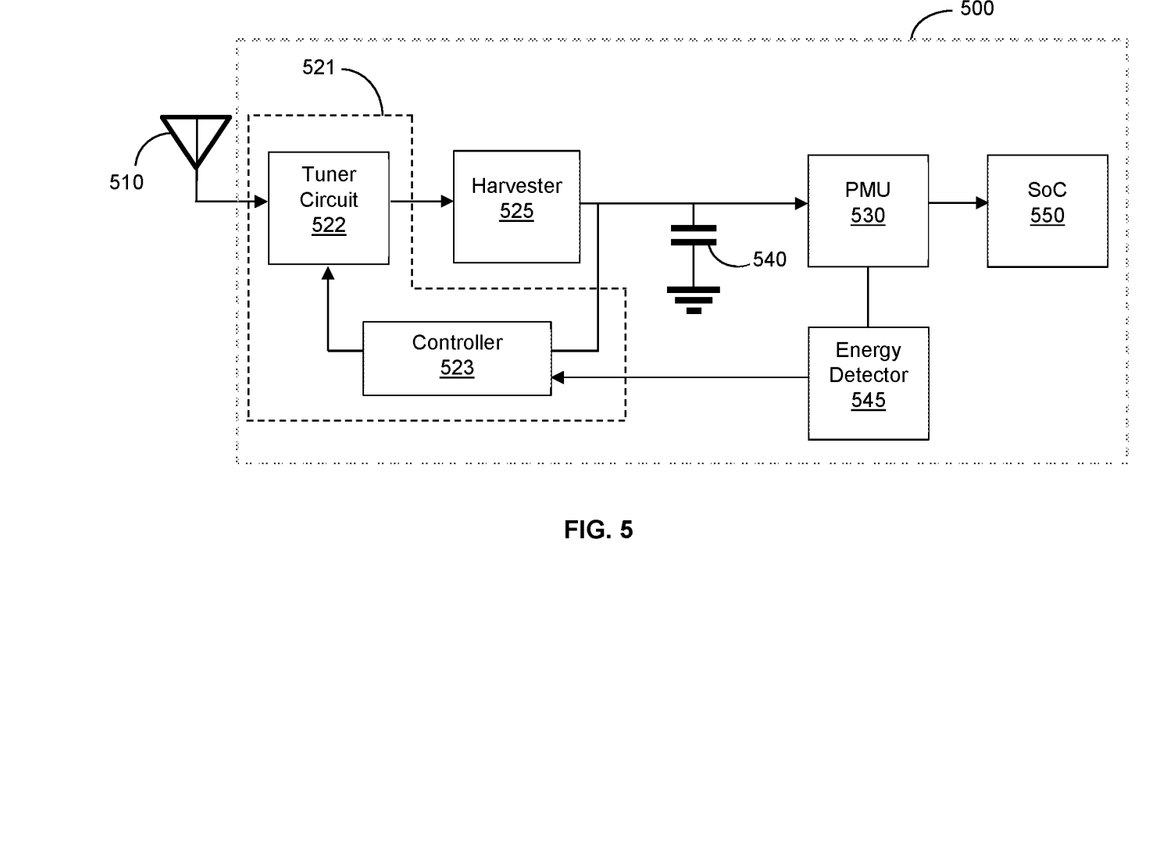
FIG. 5 is a block diagram of an IoT tag with details of an antenna tuner according to an embodiment.

FIG. 5 is an example block diagram of an IoT tag 500 with details of an antenna tuner according to an embodiment. The IoT tag 500 includes the various embodiments disclosed above in FIG. 4. The energy harvester (such as 420 of FIG. 4) includes the antenna tuner 521 and a harvester 525 and is coupled to an antenna 510. The harvester 525 may be realized as a rectifier 525.

In an embodiment, the IoT tag 500 further comprises an energy storage 540, a PMU 530 that is connected to an energy detector 545 and a SoC 550. In an embodiment, the energy storage 540 may be a capacitor. In another embodiment, the energy storage 540 may be a rechargeable battery.

In an embodiment, the antenna tuner 521 is configured with a tuner circuit 522 and a controller 523. The controller 523 samples the energy detector 545 output, and thus controls the capacitance of the tuner circuit 522 components. In one embodiment, the controller 523 may be a digital controller including a finite state machine. The presence of a digital interface may be particularly useful in modern chip processes to benefit from integration of digital and software techniques.

In one embodiment, the tuner circuit 522 includes a capacitor with a switch, switch-cap having two states. In another embodiment, the tuner circuit 522 includes varactors, which are voltage dependent capacitors. In an example embodiment, the varactor capacitance is maintained similar to the value at 0 v on the storage device by a pull-down device that shunts the controls to the ground and keeps at this state until a tuning voltage is available from the energy harvester. When a tuning voltage is supplied, the digital buffer within the tuner circuit 522 takes control over the voltage nodes to maintain the varactor, still at 0 v. In order to activate the tuner to adapt the antenna frequency, a non-zero voltage may be applied to the varactor. Such circuit is advantageous in that only two voltage levels are implemented and allow simple digital to capacitance coding.

In an embodiment, the controller 523 may be configured to have a middle tuning band starting point via a capacitance control range that is centered at 0 v for the tuner circuit 522 to provide a wider tuning range, while minimizing the power consumption. Such configuration of the controller 523 enables the antenna tuner 521 to function even at states of frequency mismatch when the energy availability is very low.

In one example embodiment, two types of varactor devices are realized where one type increases capacitance and the other decreases capacitance to an applied voltage. In another example embodiment, a single type of device such as a MOS transistor (CMOS, FinFET), a diode, a MOSCAP (an accumulation mode device), varactor with a monotonic capacitance to voltage response around 0 v and a negative voltage response to tune below 0 v is implemented. The control range centered at 0 v may prevent large frequency drift of antenna during tuning and thus minimize frequency offset between the energy source and the harvesting antenna 510. Furthermore, such capacitance control range reduce antenna tuner 521 size for a more compact design. In an embodiment, the tuner circuit 522 may include plurality of each of the circuit components disclosed.

The efficiency and the charging rate of the IoT tag 500 may depend on the sensitivity of the operation of a tuner circuitry including a tuner circuit 522, a controller 523, and a harvester 545. At the tuner mode of operation, the antenna tuner 521 is configured to adjust the antenna frequency, and at the functional (or active) mode of operation, the energy harvester of the IoT tag 500 harvests energy. Here, sensitivity is the response to an AC voltage applied on the energy harvester input, for example, higher sensitivity in tuner mode enables antenna frequency tuning at very low applied voltage.

In an embodiment, the tuner mode is configured to be more sensitive than the functional mode of the energy harvester. Such configuration improves the efficiency and charging rate by effectively adjusting the frequency to optimum bandwidth at power levels that are lower than the functional mode. In a further embodiment, the tuner mode and the functional mode may be set to same sensitivity, which allow prompt activation of both modes to improve charging rate of the energy harvester.

Figure 6:
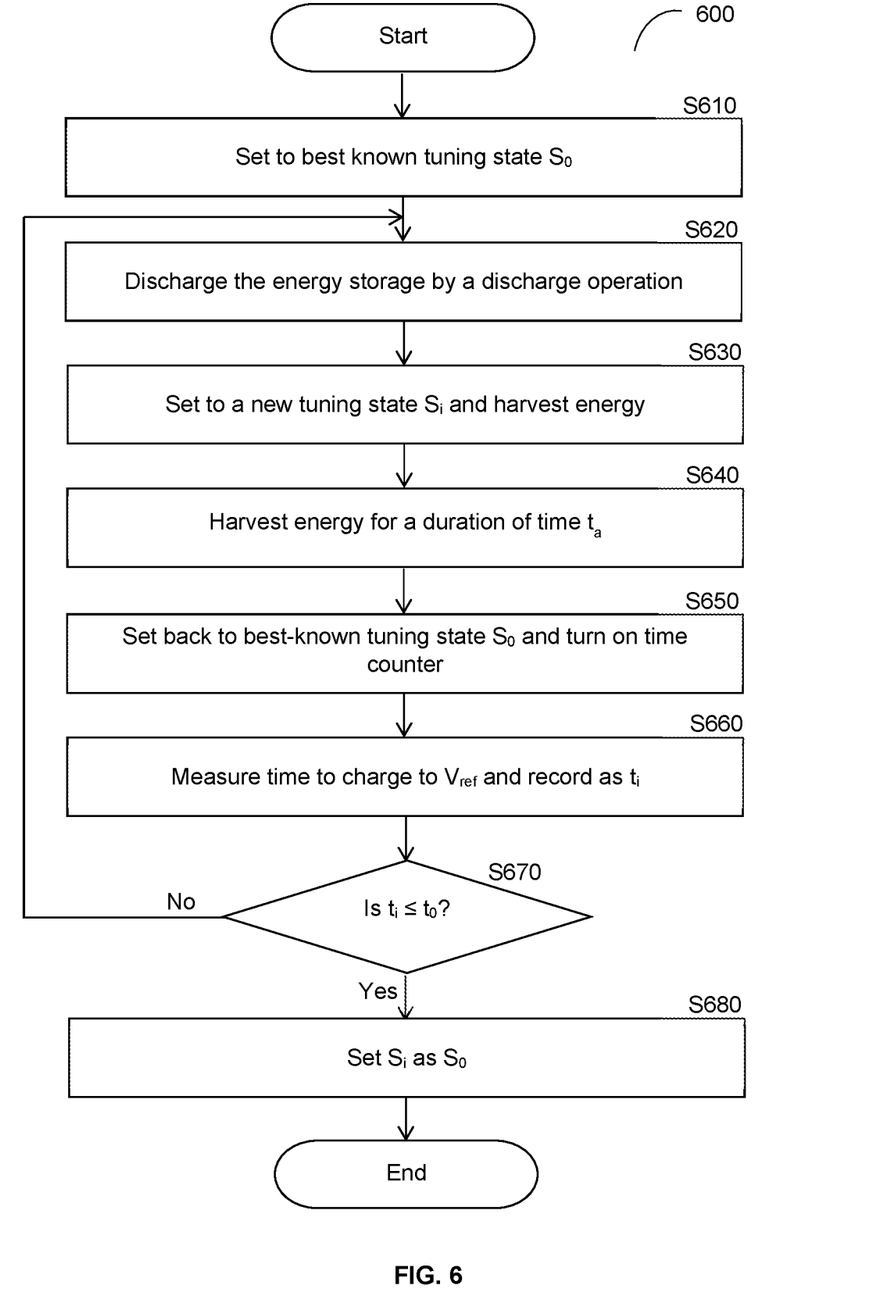
FIG. 6 is a flowchart illustrating a method for tuning an antenna frequency according to an embodiment.

FIG. 6 shows an example flowchart 600 illustrating a method for tuning an antenna frequency for optimized energy harvesting according to an embodiment. The tuning method actively utilizes the charge time measured by the energy detector. In an embodiment, the method is performed by the IoT tag (500 FIG. 5) that includes an antenna tuner (521, FIG. 5).

At S610, an antenna tuner is set to a best-known tuning state, $S_0$. Each state $S_0$ through $S_i$ (where i is an integer equal or greater than 1) refers to a setting that adjusts the antenna interface impedance, thus changes the antenna resonance frequency. The best-known tuning state $S_0$ provides the highest charging rate currently available to the IoT tag. In an embodiment, $S_0$ and its charge time, $t_0$, may be provided by a controller (e.g., controller 523, FIG. 5). A tuning state may be a voltage level, a digital word, an analog signal, or any means for changing the varactor, the switch, and/or other means that causes changing the impedance of the antenna interface.

At S620, the energy storage is discharged by performing a predefined discharge action. The predefined discharge action is the same action being performed at any time a discharge operation is required. Such discharge operation is selected not to fully discharge the energy storage, but to discharge sufficiently enough to allow time counting during an energy storage recharge. In some example embodiments, the discharge operation may be selected to discharge the energy storage to less than 10% of the reference level. The reference level may be a voltage level ($V_{ref}$) which may be equal to 1 v. In an embodiment, the energy storage is at least one of: a capacitor and a rechargeable battery to store harvested energy.

At S630, the antenna tuner is set to a new tuning state, $S_i$. The new tuning state, $S_i$, changes the antenna resonance frequency from that of the best tuning state, $S_0$. The energy harvester is configured to harvest energy at the new antenna frequency bandwidth.

At S640, energy is harvested to a predefined time interval, $t_a$. The energy harvester harvests energy from signals received by the antenna, such energy is stored in the energy storage, while the time counter continues to count time until reaching $t_a$.

At S650, the antenna tuner is set back to the best-known tuning state, $S_0$. Upon reaching the time, $t_a$, the antenna tuner setting is reverted to $S_0$ and the time counter is turned on. The time counter continues to record the passing time to determine the charge time for the energy storage to reach back to the reference level ($V_{ref}$). Such operation of reverting back to the best-known tuning state ensures at least some energy harvesting and prevents complete depletion of the stored energy in the IoT tag. It should be noted that antenna tuning is an energy consuming process that can deplete the stored energy in absence of simultaneously harvesting sufficient energy to supply for antenna tuning. For example, if the new tuning state, $S_i$, adjusts the antenna frequency to a complete mismatch from the available electromagnetic signal frequencies in the surrounding, only a small amount of energy, at best, may be harvested. In this scenario, due to insufficient energy harvesting, the antenna tuning process may deplete all the stored energy to result an inoperable IoT tag. To this end, the disclosed embodiment allows IoT tag functioning even at untuned conditions of the antenna frequency.

At S660, the time to charge the energy storage to the reference level, $V_{ref}$, is measured. The time counter is turned off (i.e., stop the counter) when the energy storage reaches $V_{ref}$ and the time value is recorded as $t_1$, a charge time at tuning state $S_i$.

At S670, the measured charge time, $t_i$, is compared against the charge time at best known tuning setting, $t_0$. In an embodiment, an optimized antenna frequency state is when the charge time is the shortest from the alignment of the source frequency and the antenna resonance frequency. If $t_1$ is greater than $t_0$, the operation returns to S620 to continue the process of tuning for optimized energy harvesting. If $t_i$ is equal or less than $t_0$, the source and antenna resonance frequencies are determined to be well aligned in the new state, $S_i$, and the operation continues to S680. In an embodiment, the charge times $t_1$ and $t_0$, as well as their settings $S_i$ and $S_0$, respectively, may be stored in an external memory or within an on-tag memory (not shown), e.g., a non-volatile memory (NVM), for future reference and comparison.

At S680, $S_i$ is set as the new $S_0$. Here, $S_i$ is determined to show better frequency matching and harvesting efficiency and now set as the new best tuning state, $S_0$. For following antenna tuning and optimization of the energy harvester, the new $S_0$ may be used as the starting best tuning state. In an embodiment, when antenna tuning and its frequency bandwidth have been optimized, the stored energy may be used for functional applications in the SoC of the IoT tag.

The method discussed herein may be performed at a restart of an IoT tag, where the state $S_0$ may be predetermined. The method can be performed upon detection of a movement of the tag to allow optimal charging at the new location.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A method for tuning an antenna frequency of an energy harvester, comprising:
   setting an antenna tuner to a first tuning state, wherein the first tuning state sets the antenna frequency to a first frequency and includes a first charge time, wherein the first charge time is a shortest charge time currently known;

discharging an energy storage coupled to the energy harvester to a first voltage level;
setting the antenna tuner to a second tuning state, wherein the second tuning state changes the antenna frequency to a second frequency;
harvesting an ambient energy until a predefined time interval;
setting the antenna tuner to the first tuning state;
starting a time counter upon reaching the predefined time interval;
measuring a second charge time for the energy storage to reach a reference level, wherein the reference level is a predetermined voltage level; and
replacing the first tuning state with the second tuning state as a new first tuning state when the second charge time is less than the first charge time, wherein replacing is indicative of frequency matching of the second frequency and an ambient energy frequency.

2. The method of claim 1, further comprising: iteratively selecting the second tuning state.

3. The method of claim 1, wherein the second charge time greater than the first charge time indicates a frequency mismatch of the second frequency and the ambient energy frequency.

4. The method of claim 1, wherein the first tuning state is any of: a predetermined tuning state and a stored tuning state in a memory.

5. The method of claim 1, wherein the first tuning state and the second tuning state is any of: a voltage level, a digital word, and an analog signal.

6. The method of claim 1, wherein the antenna tuner includes a tuner circuit and a controller, wherein the tuner circuit includes at least one adjustable capacitor, and wherein setting any of the first or second tuning states include changing the at least one adjustable capacitor.

7. An energy harvester, comprising:
a tuner circuit coupled to at least one antenna, wherein the tuner circuit includes at least one adjustable capacitor, wherein the at least one antenna is configured to harvest an electromagnetic ambient energy;
a rectifier to convert the electromagnetic ambient energy to a direct current; and
a controller connected to the tuner circuit and configured to control a voltage level within the energy harvester;
wherein the controller is further configured to:
set the at least one adjustable capacitor to a first tuning state, wherein the first tuning state sets an antenna frequency to a first frequency and includes a first charge time, wherein the first charge time is a shortest charge time currently known;
discharge an energy storage coupled to the energy harvester to a first voltage level;
set the at least one adjustable capacitor to a second tuning state, wherein the second tuning state changes the antenna frequency to a second frequency;
harvest the electromagnetic ambient energy until a predefined time interval;
set an antenna tuner to the first tuning state;
start a time counter upon reaching the predefined time interval;
measure a second charge time for the energy storage to reach a reference level, wherein the reference level is a predetermined voltage level; and
replace the first tuning state with the second tuning state as a new first tuning state when the second charge time is less than the first charge time, wherein replacing is indicative of frequency matching of the second frequency and a frequency of the electromagnetic ambient energy.

8. The energy harvester of claim 7, wherein the energy harvester is configured with a control range centered at 0 v for the at least one adjustable capacitor to match the antenna frequency and the frequency of the electromagnetic ambient energy.

9. The energy harvester of claim 7, wherein each of the at least one adjustable capacitor is any of: a varactor and a switch-cap.

10. The energy harvester of claim 7, wherein the controller is a finite state machine.

11. The energy harvester of claim 7, wherein the controller is further configured to:
apply a plurality of tuning states to the tuner circuit to change a capacitance of the at least one adjustable capacitor, wherein the capacitance change modifies an integrated circuit capacitive interface with the antenna.

12. The energy harvester of claim 9, wherein the varactor includes at least one of: a varactor that increases capacitance with applied voltage and a varactor that decreases capacitance with applied voltage.

13. The energy harvester of claim 9, wherein the varactor is a monotonic capacitor.

14. The energy harvester of claim 7, wherein the tuner circuit further comprises: a pull-down device.

15. A wireless internet of things (IoT) tag comprising:
at least one antenna configured to harvest an ambient energy, wherein the at least one antenna has a capacitive interface;
an energy harvester coupled to the at least one antenna, wherein the energy harvester includes a tuner circuit, a controller, and a rectifier, wherein the tuner circuit includes at least one adjustable capacitor, wherein the controller is connected to the tuner circuit, wherein the controller is configured to iteratively set the at least one adjustable capacitor to tuning states until a best tuning state is set, wherein the best tuning state of the at least one adjustable capacitor substantially matches an antenna frequency and a frequency of the ambient energy;
an energy storage coupled to the energy harvester and configured to store harvested energy; and
an energy detector connected to the energy storage, wherein the energy detector is configured to measure a charge time of the energy storage and activate the controller.

16. The wireless IoT tag of claim 15, wherein the energy harvester is configured with a control range centered at 0 v for the at least one adjustable capacitor to match the antenna frequency and the frequency of electromagnetic ambient energy.

* * * * *